(12) United States Patent
Lee et al.

(10) Patent No.: US 9,564,343 B2
(45) Date of Patent: Feb. 7, 2017

(54) METHOD OF MANUFACTURING SEMICONDUCTOR DEVICES

(71) Applicant: Samsung Electronics Co., Ltd., Suwon-si (KR)

(72) Inventors: Mongsup Lee, Hwaseong-si (KR); Yoonho Son, Hwaseong-si (KR); Sang-Jun Lee, Incheon (KR); Munkwon Kang, Suwon-si (KR); Kyunghyun Kim, Seoul (KR); Inseak Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/990,353

(22) Filed: Jan. 7, 2016

(65) Prior Publication Data

US 2016/0307773 A1 Oct. 20, 2016

(30) Foreign Application Priority Data

Apr. 15, 2015 (KR) ........................ 10-2015-0053177

(51) Int. Cl.
*H01L 21/302* (2006.01)
*H01L 21/461* (2006.01)
*H01L 21/311* (2006.01)

(52) U.S. Cl.
CPC ................ *H01L 21/31116* (2013.01)

(58) Field of Classification Search
USPC ....................................................... 438/734
See application file for complete search history.

(56) References Cited

U.S. PATENT DOCUMENTS

| | | |
|---|---|---|
| 6,148,832 A | 11/2000 | Gilmer et al. |
| 6,217,951 B1 | 4/2001 | Mizuno et al. |
| 6,329,297 B1 | 12/2001 | Balish et al. |
| 6,635,845 B2 | 10/2003 | Lee et al. |
| 6,773,933 B2 | 8/2004 | Ma et al. |
| 6,843,858 B2 | 1/2005 | Rossman |
| 7,207,339 B2 | 4/2007 | Chen et al. |
| 7,385,670 B2 | 6/2008 | Compen et al. |
| 7,569,256 B2 | 8/2009 | Ichijo |
| 2008/0314408 A1 | 12/2008 | Jeong et al. |
| 2013/0084707 A1 | 4/2013 | Hashimoto et al. |
| 2013/0309856 A1 | 11/2013 | Jagannathan et al. |
| 2015/0187593 A1* | 7/2015 | Narushima ......... H01L 21/6708 438/735 |

FOREIGN PATENT DOCUMENTS

| | | |
|---|---|---|
| JP | 2010165954 A | 7/2010 |
| KR | 20020055173 A | 7/2002 |

* cited by examiner

*Primary Examiner* — Roberts Culbert
(74) *Attorney, Agent, or Firm* — Myers Bigel, P.A.

(57) ABSTRACT

A substrate having an insulating layer including an oxide is loaded into a chamber, and at least a part of the insulating layer is removed by injecting a process gas including an etching source gas into the chamber. The removal process is performed in a pulse type in which a first period and a second period are repeated a plurality of times. The etching source gas is supplied at a first flow rate during the first period and is supplied at a second flow rate less than the first flow rate during the second period. A temperature of the inside of the chamber remains at 100° C. or more during the removal process.

20 Claims, 20 Drawing Sheets

METHOD OF MANUFACTURING SEMICONDUCTOR DEVICES

CROSS-REFERENCE TO RELATED APPLICATION

This application claims priority under 35 U.S.C. §119 of Korean Patent Application No. 10-2015-0053177, filed on Apr. 15, 2015, the entire content of which is hereby incorporated by reference in its entirety.

BACKGROUND

Example embodiments of the inventive concept relates to methods of manufacturing semiconductor devices, and more particularly, to a method of removing an insulating layer on a semiconductor substrate.

Semiconductor devices are widely used in the electronics industry due to their small size, multi-functional characteristics and/or low manufacturing costs. Semiconductor devices may be classified into semiconductor memory devices that store logical data, semiconductor logical devices that perform a logical data operation process, and hybrid semiconductor devices including memory elements and logical elements. The development of the electronics industry has demanded semiconductor devices with excellent characteristics. For instance, there has been an increasing demand for highly-reliable, high-speed and/or multi-functional semiconductor devices. To satisfy those demands, the structures in the semiconductor devices are becoming more complicated and the semiconductor devices are becoming more highly integrated.

SUMMARY

Example embodiments of the inventive concept provide a method of manufacturing a semiconductor device. The method may include loading a substrate, on which an insulating layer including oxide is formed, into a chamber, and injecting a process gas including an etching source into the chamber to remove at least a part of the insulating layer. The removal process is performed in a pulse type in which a first period and a second period are repeated a plurality of times. The etching source gas is supplied at a first flow rate during the first period and is supplied at a second flow rate less than the first flow rate during the second period. A temperature of the inside of the chamber remains at about 100° C. or more during the removal process.

In some example embodiments of the inventive concept, the second period may be an off state, in which the supply of the etching source may be interrupted such that the supply of the etching source gas may be repeatedly turned-on and turned-off during the removal process.

In some example embodiments of the inventive concept, the second period may be longer than the first period.

In some exemplary embodiments of the inventive concept, the second period may be from about 3 to about 15 times as long as the first period.

In some example embodiments of the inventive concept, the first period may range from about 1 second to about 20 seconds, and the second period may range from about 5 seconds to about 60 seconds.

In some example embodiments of the inventive concept, sublimation of etching by-products generated while the insulating layer is removed may proceed during the second period.

In some example embodiments of the inventive concept, the process gas may be supplied to the chamber in a gas state that does not become plasma, or by a remote plasma method.

In some example embodiments of the inventive concept, the etching source comprises HF and NH$_3$ or comprises at least two of NF$_3$, NH$_3$, HF and H$_2$.

In some example embodiments of the inventive concept, a pressure of the process gas of the inside the chamber during the second period may remain the same as a pressure of the process gas of the inside the chamber during the first period.

In some example embodiments of the inventive concept, the pressure of the process gas in the chamber during the first and second periods during may be changed in a pulse type in such a way which the third period and the fourth period are alternately repeated. The pressure of the process gas in the chamber may remain at a first pressure during the third period and may remain at a second pressure lower than the first pressure during the fourth period.

In some example embodiments of the inventive concept, the process gas may be purged during the fourth period.

In some example embodiments of the inventive concept, a start point and an end point of the third period may be the same as a start point and an end point of the first period, respectively, and a start point and an end point of the fourth period may be the same as a start point and an end point of the second period, respectively.

In some example embodiments of the inventive concept, a start point and an end point of the third period may be later than a start point and an end point of the first period, respectively, and a start point and a start point and an end point of the fourth period may be later than a start point and an end point of the second period, respectively.

Example embodiments of the inventive concept also provide a dry cleaning method. The dry cleaning method may include loading a substrate, on which an insulating layer including oxide is formed, into a chamber, and removing at least a part of the insulating layer by injecting a process gas including an etching source gas into the chamber. The removal process may be performed in a pulse type in which an on-state and an off-state of the supply of the etching source may be alternately repeated a plurality of times. A temperature of the inside of the chamber may remain at about 100° C. or more during the removal process.

In some example embodiments of the inventive concept, a pulse width corresponding to the on-state of the supply of the etching source may be less than a pulse interval corresponding to the off-state of the supply of the etching source.

In embodiments of the inventive concept, a temperature of the inside of the chamber may remain at about 200° C. or less during the removal process.

In some example embodiments of the inventive concept, etching by-products generated while the insulating layer is removed may be sublimated during the off-state.

In some example embodiments of the inventive concept, the process gas may be purged during the off-state.

In some example embodiments of the inventive concept, the removal process may be performed without applying bias power for controlling an energy that collides with the substrate.

Example embodiments of the inventive concept provide a method of manufacturing a semiconductor device. The method may include forming a first layer and a second layer including a material having an etch selectivity with respective to the first layer, on a substrate. The first layer may include an insulating material and may be horizontally adjacent to the second layer. The method may include removing at least a part of the first layer. The removal of the at least a part of the first layer may include loading a substrate on which the first and second layers are formed, into a chamber and supplying an etching source gas into the chamber in a pulse type in which a first period and a second period are repeated a plurality of times. The etching source gas may be supplied at a first flow rate during the first period and may be supplied at a second flow rate less than the first flow rate during the second period. A temperature of the inside of the chamber may remain at about 100° C. or more during the removal of the at least a part of the first layer.

Other example embodiments of the inventive concept provide, for example, electronic systems, memory cards and information processing systems, comprising a semiconductor device fabricated according to methods of the inventive concept.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION

Figure 1:
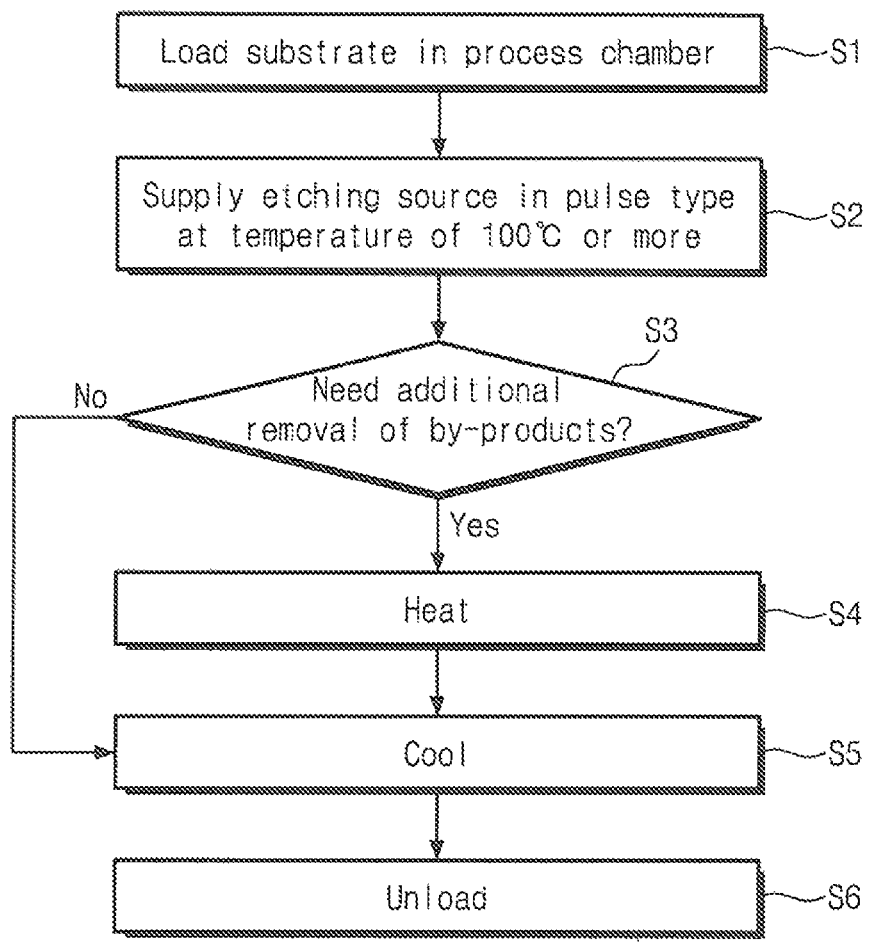
FIG. 1 is a process flowchart for explaining a method of manufacturing a semiconductor device in accordance with an example embodiment of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, etc. may be used herein to describe various elements, these elements should not be limited by these terms. These terms are only used to distinguish one element from another. It will also be understood that when an element such as a layer, region or substrate is referred to as being "on" or "onto" another element, it may lie directly on the other element or intervening elements or layers may also be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the inventive concept may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Figure 2:
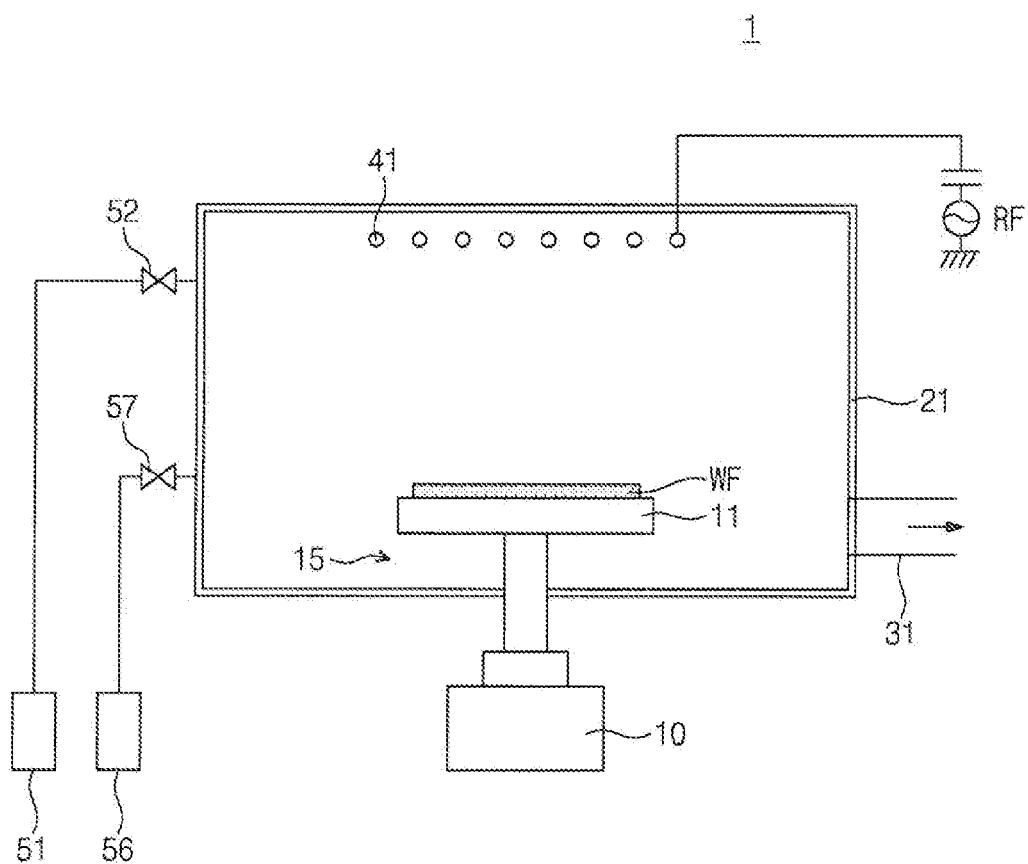
FIG. 2 is a diagram of a process chamber in which a process of removing an insulating layer of a semiconductor device in accordance with an example embodiment of the inventive concept is performed.

FIG. 1 is a process flowchart for explaining a method of manufacturing a semiconductor device in accordance with an embodiment of the inventive concept. FIG. 2 is a diagram of a process chamber in which a process of removing an insulating layer of a semiconductor device in accordance with an example embodiment of the inventive concept is performed.

Referring to FIGS. 1 and 2, a substrate WF may be loaded into a process chamber 1 (S1). The substrate WF may be placed on a supporting member disposed inside a housing 21 of the process chamber 1. The supporting member may include a supporting plate 11 fixing the substrate WF during a process and a driving member 10 moving the supporting plate 11. The supporting plate 11 may have a disc shape and may fix the substrate WF by a vacuum absorption method, a mechanical clamping method or electrostatic force. The driving member 10 may include a cylinder or a motor and may linearly move and rotate the substrate WF.

Figure 3:
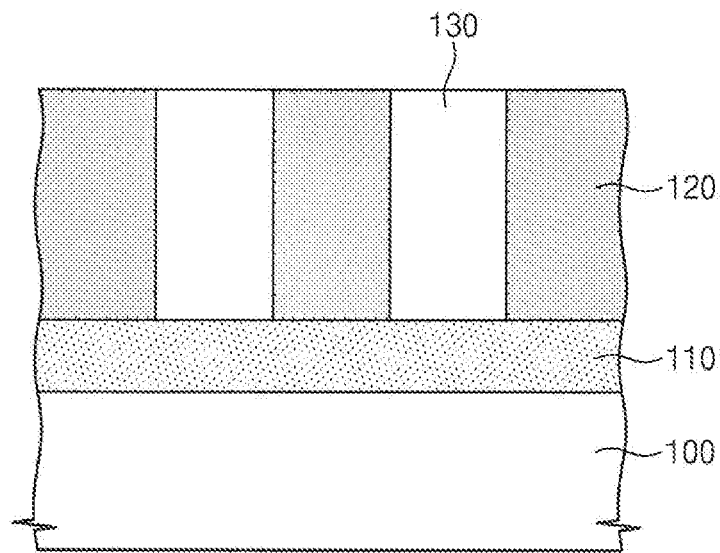
FIGS. 3 through 5 are cross sectional views illustrating a portion of a substrate to explain a process of removing an insulating layer.
Figure 4:
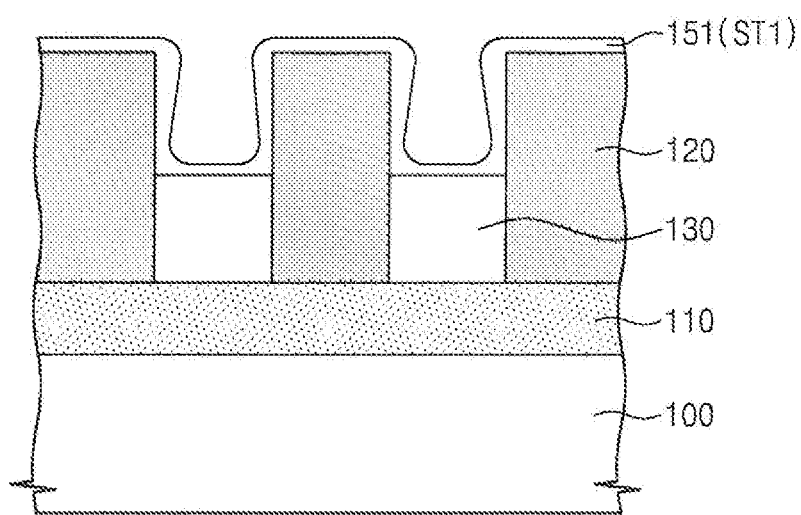
Figure 5:
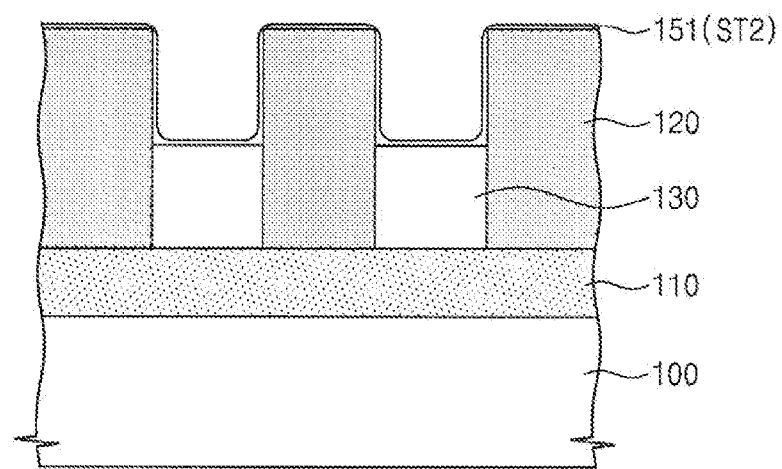
Figure 6:
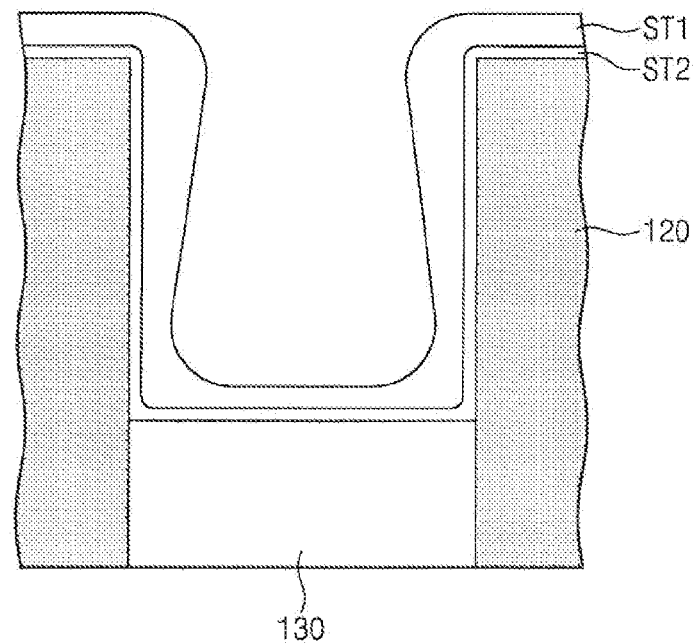
FIG. 6 is a conceptual view for explaining a change of etching by-products in a process of removing an insulating layer in accordance with an example embodiment of the inventive concept.
Figure 7:
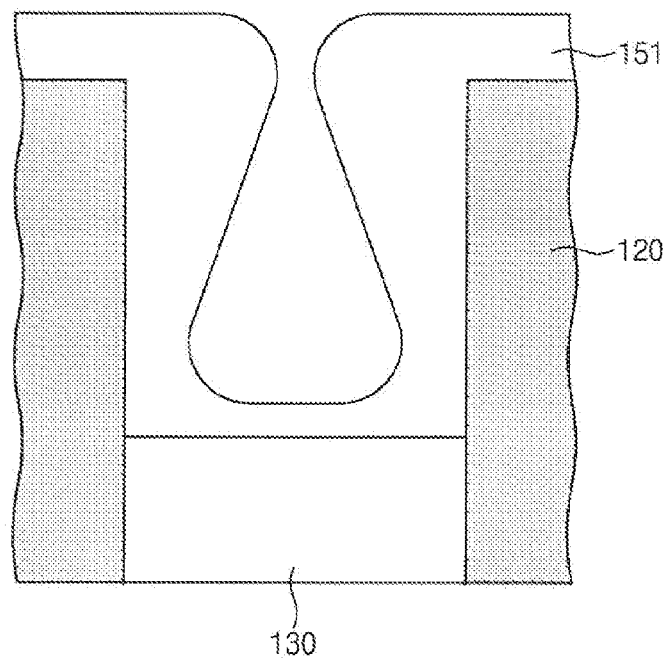
FIG. 7 is a conceptual view for explaining a change of etching by-products in accordance with a comparative example.

FIGS. 3 through 5 are cross sectional views illustrating a portion of a substrate (WF) to explain a process of removing an insulating layer. FIG. 6 is a conceptual view for explaining a change of etching by-products in a process of removing an insulating layer in accordance with an example embodiment of the inventive concept. FIG. 7 is a conceptual view for explaining a change of etching by-products in accordance with a comparative example.

Referring to FIG. 3, a base layer 110 may be provided on a substrate 100, and first patterns 120 and second patterns 130 may be provided on the base layer 110. The substrate 100 may be a silicon, germanium or sapphire substrate. The base layer 110 may be a middle layer including a different material from the substrate 100 and the first and second patterns 120 and 130. In some embodiments, the base layer 110 may not be provided. The second patterns 130 may be removal target patterns. The second patterns 130 may include an insulating material including an oxide. For example, the second patterns 130 may include silicon oxide. The first patterns 120 may include a material having an etch selectivity with respect to the second patterns 130. That is, in a process of removing the second patterns 130, the first patterns 120 may not be removed or a relatively small amount of the first patterns 120 may be removed. For example, the first patterns 120 may include a metal, a semiconductor material, or a nitride-based insulating layer such as silicon nitride.

A process of removing the second patterns 130 may be performed in the process chamber 1 described with reference to FIG. 2. A process gas may be supplied into the process chamber 1. The process gas may include an etching source gas and other source gases. The etching source gas indicates a source gas substantially involved in a physical/chemical etching reaction. The other source gases are constituent elements of the process gas except the etching source gas. For example, the other source gases may include a gas such as $N_2$ or Ar. The etching source gas may be supplied from an etching source 51 and another source 56 that are connected to the process chamber 1, and flow rates of the etching source 51 and the another source 56 may be adjusted through first and second valves 52 and 57.

The process gas may be supplied to the substrate WF without applying bias power. That is, the process gas may be supplied into the process chamber 1, in which the process gas does not become plasma, or the process gas may be supplied into the process chamber 1 by a remote plasma method. A process gas supplied in a non-plasma state may not become plasma even in the process chamber 1 by applying a source power. In the case where the process gas is supplied to the process chamber 1 by a remote plasma method, the removal process may be performed without applying a bias power for controlling energy of ions colliding with the substrate WF. Hereinafter, an etching process which is performed without applying the bias power is called a dry cleaning process.

In the case where the etching source gas is supplied into the process chamber 1 in which the process gas does not become plasma, the etching source gas may include HF and $NH_3$. In the case where the etching source gas is supplied to the process chamber 1 by a remote plasma method, the etching source gas may include at least two of $NF_3$, $NF_2$, HF or $H_2$. In this case, the etching source gas may include a combination of $NF_3$ and $NH_3$, a combination of $NF_2$ and $H_2$, or a combination of $NH_3$ and HF. In the case where the etching source gas is supplied to the process chamber 1 by a remote plasma method, the etching source gas and the other source gas may become plasma together, which may then be supplied to the process chamber 1, or the etching source gas may become plasma, while the other source gas does not become plasma, which may then be supplied into the process chamber 1.

The process of removing the second patterns 130 includes supplying the etching source gas at a temperature of 100° C. or more by a pulse method (S2). That is, the removal process may be performed by the pulse method in which a first period and a second period are repeated a plurality of times. The etching source gas may be supplied at a first flow rate during the first period and may be supplied at a second flow rate less than the first flow rate during the second period. According to an example embodiment of the inventive concept, the second period is an off state in which the supply of an etching source is interrupted, and as a result, the supply of the etching source gas may be repeatedly turned-on and turned-off during the removal process. The method of supplying the etching source gas will be described later in more detail with reference to FIGS. 11 to 16.

A temperature inside the process chamber 1 may be maintained at a high temperature of about 100° C. or more during the removal process, and a cooling step is not intervened until the pulse type supply of the etching source gas is finished. For example, the temperature of the inside of the process chamber 1 may range from about 100° C. to about 200° C. The temperature of the process chamber 1 may be maintained by a heater 41 disposed inside the process chamber 1. The heater 41 may include a coil and a radio frequency (RF) power source connected to the coil. Alternatively, the heater 41 may be an ultraviolet (UV) lamp.

FIG. 4 illustrates etching by-products 151 formed during the first period in which the etching source gas is supplied at the first flow rate. For example, in the case where the etching source gas of the dry cleaning process in accordance with an example embodiment of the inventive concept includes HF and $NH_3$, a reaction expressed by the following chemical formula 1 may occur between the etching source gas and the second patterns 130.

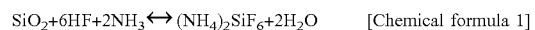

$$SiO_2 + 6HF + 2NH_3 \longleftrightarrow (NH_4)_2SiF_6 + 2H_2O \quad \text{[Chemical formula 1]}$$

That is, silicon oxide of the second patterns 130 may react with the etching source gas to form $(NH_4)2SiF_6$, i.e., ammonium silicon fluoride-based etching by-products 151 (ST1). The formation of the etching by-products is not limited thereto and may be changed depending on compositions of an etching target material and the etching source gas. The etching by-products 151 may adhere to an inner surface of a recess region formed by removing portions of the second patterns 130. That is, the etching by-products 151 may adhere to sidewalls of the first patterns 120 and top surface of the second patterns 130 of which the portions are removed. As the dry cleaning process progresses, a thickness of the etching by-products 151 may increase.

The thickness of the etching by-products 151 (ST1) may be determined by a new generation amount of the etching by-products caused according to the removal of the second patterns 130 and a sublimation amount of the etching by-products caused by a high temperature of the process chamber 1. The sublimation of etching by-products may be described by the following chemical formula 2.

$(NH_4)2SiFe_6 \leftrightarrow SiF_6+2NH_3+2HF$ [Chemical formula 2]

During the first period, the new generation amount of the etching by-products may be greater than the sublimation amount of the etching by-products due to a high flow rate of the etching source gas, and thus the thickness of the etching by-products 151 (ST1) may increase as the dry cleaning process progresses.

FIG. 5 illustrates a change of etching by-products 151 (ST2) during the second period in which the etching source gas is supplied at the second flow rate. As described above, the second flow rate may be less than the first flow rate. In an example embodiment of the inventive concept, the second flow rate may be an off state in which the etching source gas is interrupted. During the second period, a small amount of the etching source gas may be supplied or the supply of the etching source gas may be interrupted. As a result, the new generation of etching by-products may be stopped or a small amount of the etching by-products may be generated. In some embodiments, the etching by-products generated during the first period may be sublimated during the second period by the high temperature of the process chamber. As a result, the thickness of the etching by-products 151 (ST2) may be reduced.

FIG. 6 illustrates a change of a thickness of the etching by-products 151. As the first period and the second period are alternately repeated, the etching by-products 151 may alternately repeatedly become thick (ST1) and thin (ST2). FIG. 7 is a view for explaining a change of etching by-products in accordance with a comparative example which is performed without the second period of the pulse type according to an example embodiment of the inventive concepts. The etching by-products 151 may become excessively thick. In particular, the etching by-products 151 may be excessively formed on an upper sidewall of the first pattern 120. Consequently, an upper portion of the recess region may be blocked by the etching by-products 151 or may become excessively narrow by the etching by-products 151, and a supply of a process gas to the second patterns 130 may be reduced or interrupted. As a result, a process of removing the second patterns 130 may be imperfectly performed.

According to an example embodiment of the inventive concept, the process gas is supplied in the pulse type to effectively remove the etching target material without an excessive formation of etching by-products. In addition, since the excessive formation of the etching by-products is inhibited, a loading phenomenon due to a difference in pattern density may be improved.

Referring to FIGS. 1 and 2 again, it may be determined whether an additional removal process of the etching by-products is performed or not (S3). The additional removal process may be performed when a residue amount of the etching by-products is equal to or more than a critical value after the supply of the etching source gas by the pulse method is finished. In an embodiment, the additional removal process may be omitted. In the case where the additional removal process is not necessary, the substrate WF may be cooled (S5) and may be then unloaded (S6) from the process chamber 1. In an embodiment, the cooling process may include supplying a heat transfer gas (or a cooling gas) to a back side of the substrate WF through a conduit formed inside the supporting plate 11. In the case where the additional removal process is needed, the substrate WF may be heated by the heater 41 (S4). In an embodiment, the substrate WF may be moved close to the heater 41 by the driving member 10, and etching by-products on the substrate WF may be additionally sublimated by the heater 41. In an embodiment, the additional removal process of the etching by-products may be performed in an additional process chamber. After the additional removal process of the etching by-products, the substrate WF may be cooled (S5) and may be then unloaded from the process chamber 1 (S6).

Figure 8:
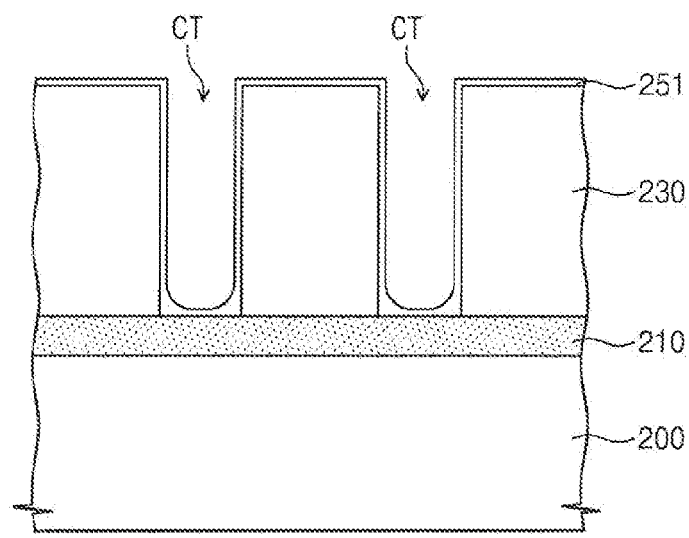
FIGS. 8 through 10 are cross-sectional views of a portion of the substrate of FIG. 2 to explain a process of cleaning a contact hole by a dry cleaning method in accordance with an example embodiment of the inventive concept.
Figure 9:
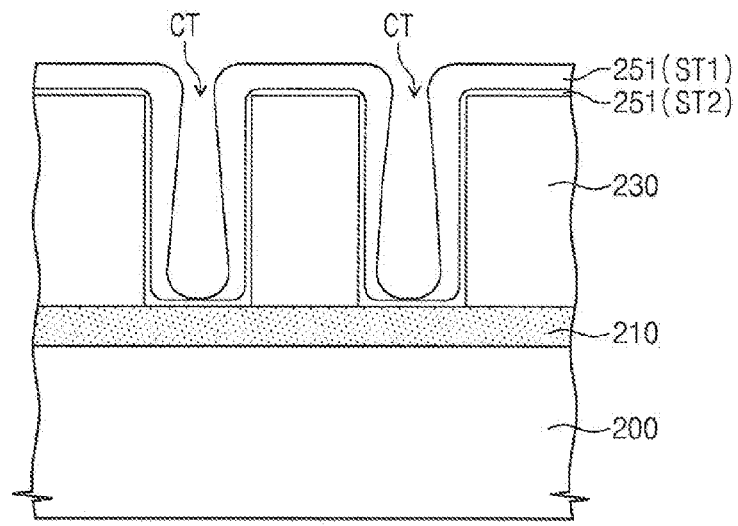
Figure 10:
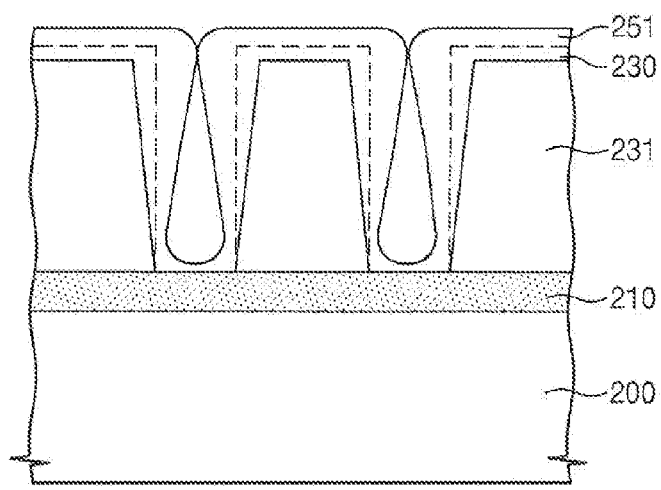

FIGS. 8 through 10 are cross-sectional views of a portion of the substrate WF of FIG. 2 to explain a process of cleaning a contact hole by a dry cleaning method in accordance with an example embodiment of the inventive concept.

Referring to FIGS. 2 and 8, a substrate 200 including an insulating layer 230 in which contact holes CT are formed is provided. A base layer 210 may be provided between the substrate 200 and the insulating layer 230. The base layer 210 may be a middle layer including a different material (e.g., a conductive layer) from the substrate 200 and the insulating layer 230. Alternatively, the base layer 210 may not be provided. The insulating layer 230 may be an insulating layer including an oxide. For example, the insulating layer 230 may be a silicon oxide layer. The contact holes CT may be a structure for forming a contact and/or an interconnection for an electrical connection between internal constituent elements of a semiconductor device but may not be limited thereto. The contact holes CT may be formed using a dry etching process, and etching by-products 251 may be formed inside the contact holes CT and on the insulating layer 230 by the dry etching process. The etching by-products 251 may be silicon fluoride-based by-products.

FIG. 9 is a conceptual view for explaining a process of removing the etching by-products 251 using a dry cleaning process in accordance with an example embodiment of the inventive concept. As illustrated in FIG. 9, a thickness of the etching by-products 251 may be alternately and repeatedly thick (ST1) and thin (ST2) while an etching source gas is supplied by a pulse method. As a result, the contact holes CT is not blocked or does not become excessively narrow, and even the etching by-products 251 located at a low part of the contract holes CT may be perfectly removed. During the dry cleaning process, a portion of the insulating layer 230 may be removed together with the etching by-products 251, so a width of the contact holes CT may widen. In this case, the etching source gas may be uniformly supplied to an upper portion and a lower portion of the contact holes CT, and thus a lower width of a final shape of the contact hole CT may be substantially equal to an upper width of the final shape of the contact hole CT. That is, a ratio of the lower width to the upper width may be close to 1.

FIG. 10 illustrates a comparative example, in which the etching source gas is supplied without the second period, such as is supplied in accordance with an example embodiment of the inventive concept. In this case, the etching by-products 251 may become excessively thick and in particular, the etching by-products 251 may be excessively formed on an upper sidewall of the insulating layer 230. Consequently, the upper portion of the contact hole CT may be blocked or become excessively narrow as a result of the etching by-products 251, and the supply of the process gas into lower portions of the contact hole CT may be reduced or interrupted. In this case, the etching source gas may diffuse more easily into the upper portion of the insulating layer 230 to etch a relatively large amount of the upper portion of the insulating layer 230, but it is more difficult for the etching source gas to diffuse into the lower portion of the insulating layer 230, thereby etching a relatively small amount of the lower portion of the insulating layer 230. As a result, the upper width of the contact hole CT formed in a final insulating layer 231 may be greater than the lower width of the contact hole CT formed therein. That is, the sidewall of the final insulating layer 231 may have a slope.

In contrast, according to example embodiments of the inventive concept, the etching source gas is supplied by a pulse method, so the excessive formation of etching by-products is inhibited and/or reduced. Thus, a cleaning process of the contact holes may effectively performed.

FIGS. 11 through 16 are timing diagrams for explaining a method of supplying a process gas in accordance with example embodiments of the inventive concept. The number of repetitions of a pulse is not limited to the number of pulses illustrated in FIGS. 11 through 16.

Figure 14:
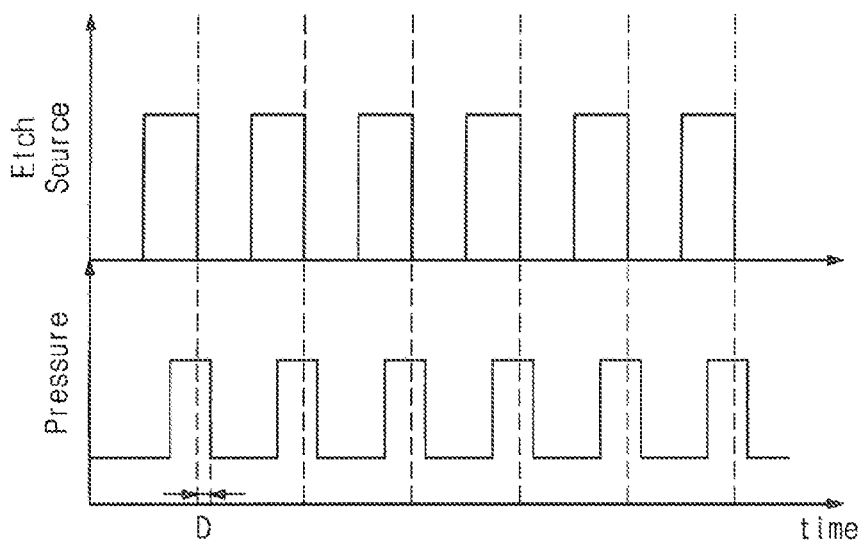
Figure 15:
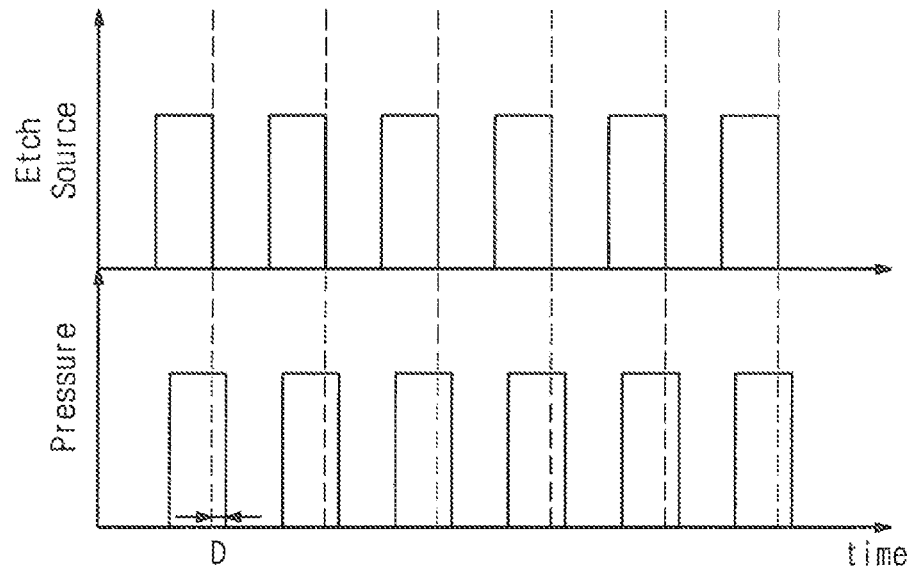
Figure 16:
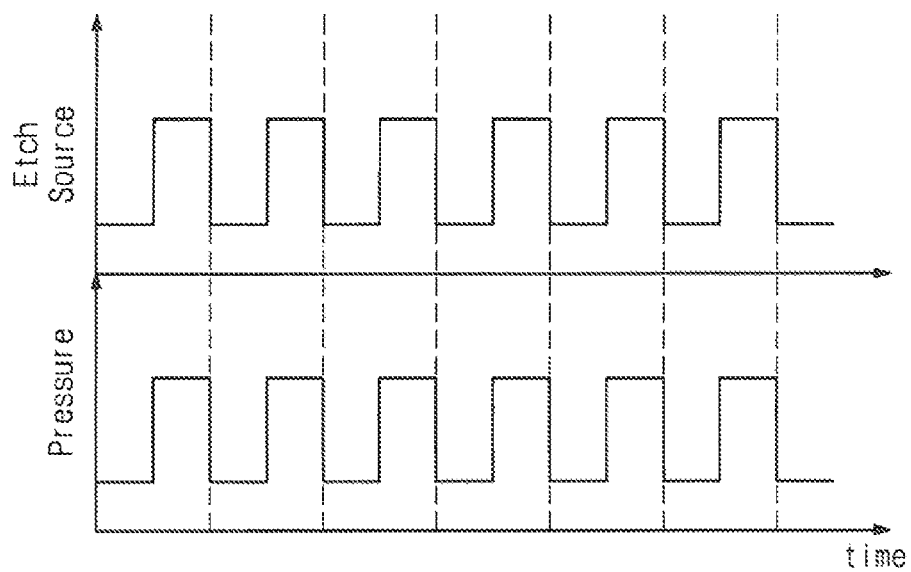

Referring to FIGS. 11 through 16, an etching source gas may be provided in a pulse form. That is, the etching source gas may be provided during first and second periods which are alternately repeated a plurality of times. The etching source gas may be supplied at a first flow rate during the first period and may be supplied at a second flow rate less than the first flow rate during the second period. A pulse width (W of FIG. 11) corresponding to the first period in which a flow rate of the etching source gas is relatively large may be relatively less than a pulse interval (V of FIG. 11) corresponding to the second period in which a flow rate of the etching source gas is relatively less. In an embodiment, a time length of the second period (i.e., the pulse interval V) may be three or fifteen times longer than a time length of the first period (i.e., the pulse width W). For example, the pulse width W may range from about 1 second to about 20 seconds, and the pulse interval V may range from about 5 seconds to about 60 seconds. The first flow rate may range from about 20 SCCM to about 1000 SCCM. The second flow rate may be essentially zero as illustrated in FIGS. 11 through 15 or may have a value except zero as illustrated in FIG. 16. In the case of FIG. 16, the second flow rate may range from about 0.01 SCCM to about 50 SCCM.

Figure 11:
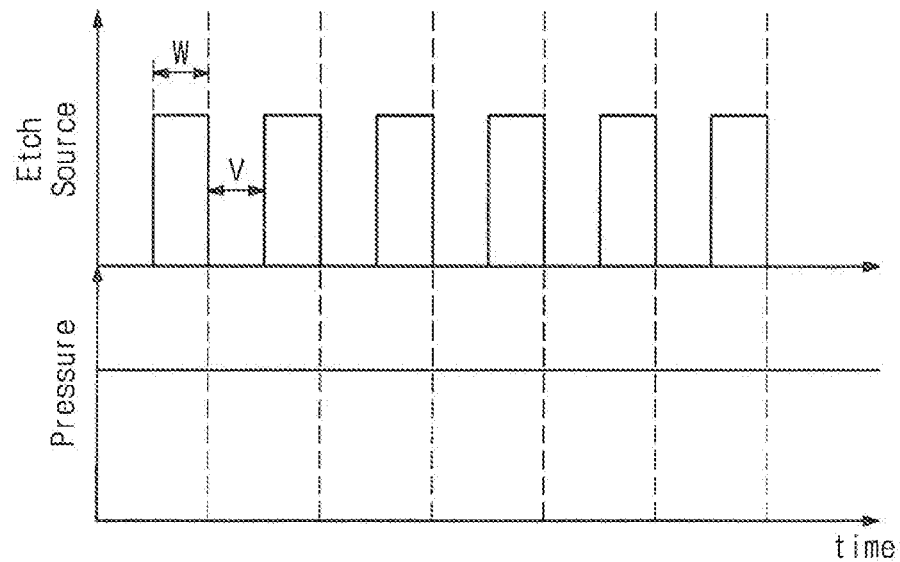
FIGS. 11 through 16 are timing diagrams for explaining a method of supplying a process gas in accordance with example embodiments of the inventive concept.

The pressure in the process chamber may be the sum of the amount of the etching source gas and the amount of the other source gas (e.g., an inert gas). The pressure in the process chamber may remain constant during the process, as illustrated in FIG. 11. For example, the pressure of the process chamber may be maintained at a pressure of about 1 Torr to about 100 Torr while the process proceeds. In this case, the amount of the inactive gas may be reduced during the first period in which a relatively large amount of the etching source gas is relatively supplied.

Figure 12:
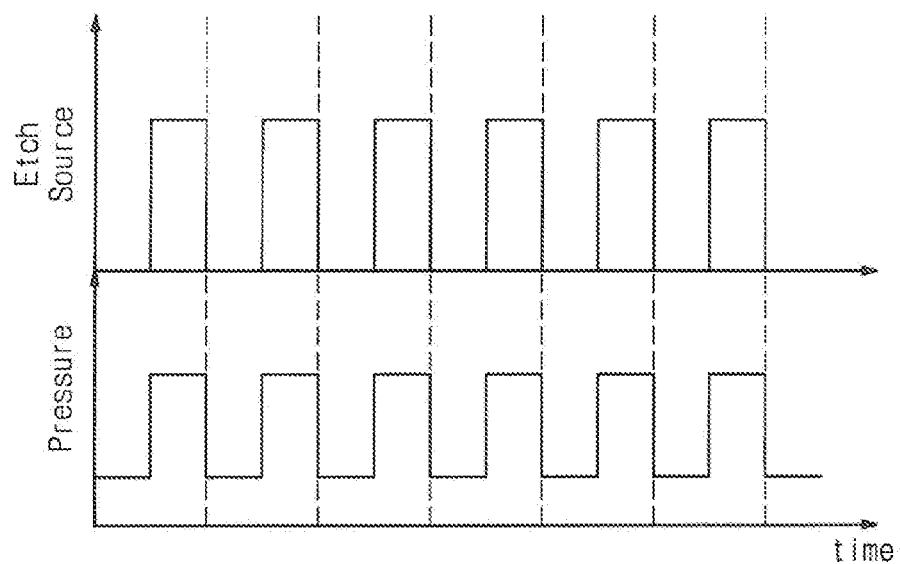
Figure 13:
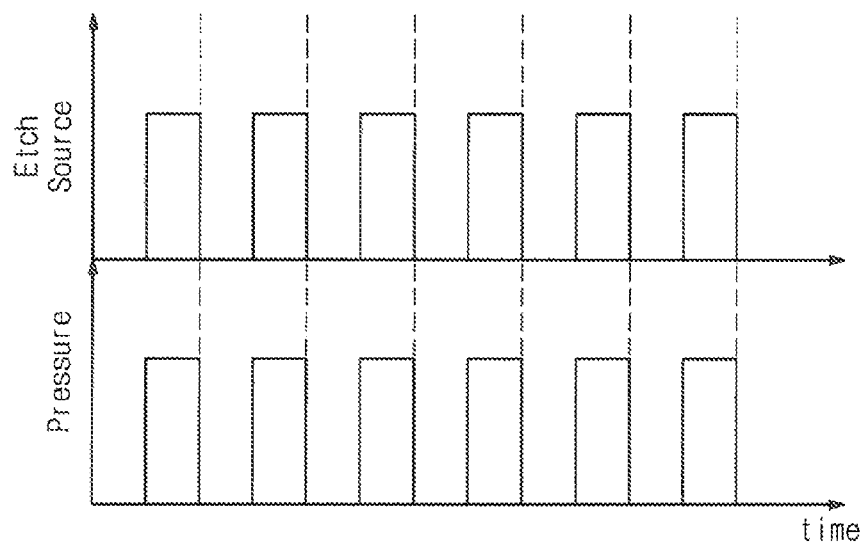

In some embodiments, the pressure of the process chamber pressure may be maintained in a pulse form, as illustrated in FIGS. 12 through 16. That is, a third period in which the pressure of the process gas is maintained at a first pressure and a fourth period in which the pressure of the process gas is maintained at a second pressure may be alternately repeated. The first pressure may range from about 1 Torr to about 100 Torr. As illustrated in FIGS. 13 and 15, the second pressure may be essentially zero. In this case, to lower the pressure of the process chamber, the process gas in the process chamber may be purged through an exhaust member 31 of FIG. 2. In other embodiments, as illustrated in FIGS. 12, 14 and 16, the second pressure may have a value which is not zero. In the case of FIGS. 12, 14 and 16, the second pressure may range from about 0.01 Torr to about 1.0 Torr. In this case, the purging process of the process chamber may not be performed.

As illustrated in FIGS. 12, 13 and 16, a timing of the pressure of the process chamber may coincide with a timing of the supply of the etching source gas. That is, a start point and an end point of the third period may be the same as a start point and an end point of the first period, respectively, and a start point and an end point of the fourth period may be the same as a start point and an end point of the second period, respectively. In an embodiment, as illustrated in FIGS. 14 and 15, a timing of the pressure of the process chamber may be delayed compared with a timing of the supply of the etching source gas. That is, a start point and an end point of the third period may be late compared with a start point and an end point of the first period, respectively, and a start point and an end point of the fourth period may be late compared with a start point and an end point of the second period, respectively. In this case, a delay time D may range from about 1 second to about 10 seconds.

Figure 17:
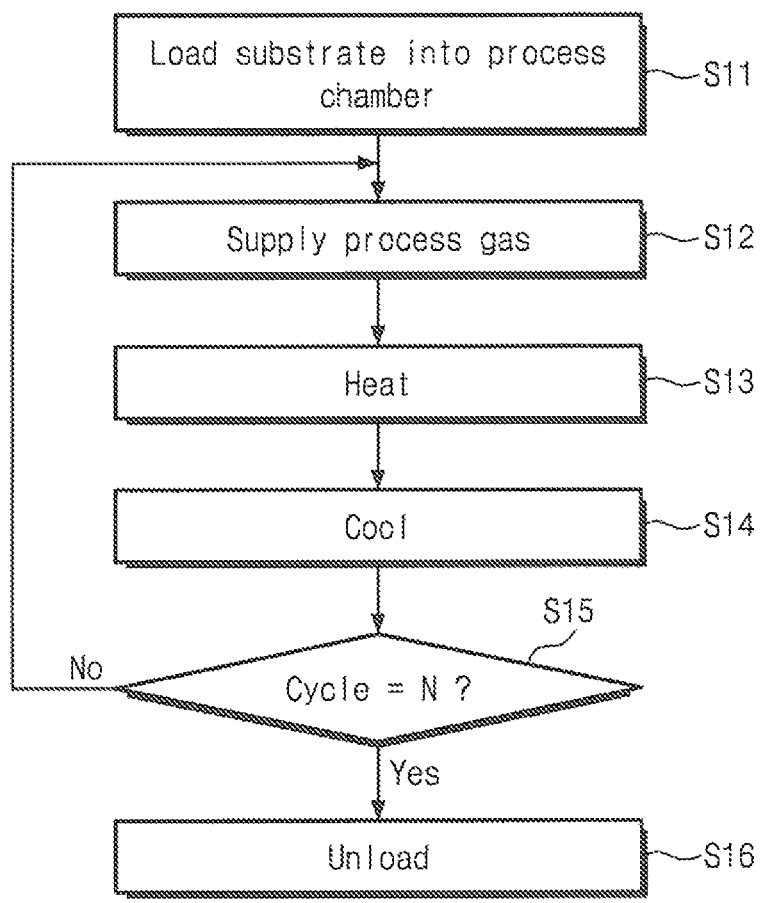
FIG. 17 is a process flowchart for explaining a method of manufacturing a semiconductor device in accordance with an example embodiment of the inventive concept.

FIG. 17 is a process flowchart for explaining a method of manufacturing a semiconductor device in accordance with an example embodiment of the inventive concept.

Referring to FIGS. 2 and 17, the substrate WF may be loaded into the process chamber 1 (S11). A process gas is supplied to the substrate WF loaded into the process chamber 1 (S12). The process gas may include an etching source gas and other source gas. A removal process of an insulating layer on the substrate WF may be performed by the etching source gas. During the removal process, the process chamber 1 may be maintained at a temperature of about 100° C. or more (e.g., about 100° C. to about 200° C.). That is, in the present step, only the etching process may be performed and sublimation of etching by-products may not be substantially performed. The removal process of the insulating layer may be performed for a time of about 10 seconds to about 5 minutes.

Sublimation of the etching by-products may proceed by heating the substrate WF (S13). As an example, the substrate WF may be heated by the heater 41 disposed in the process chamber 1. The substrate WF may be moved close to the heater 41 by the driving member 10, and the etching by-products on the substrate WF may be sublimated by the heater 41. In an embodiment, the heating process may be performed in an additional process chamber.

After the heating process is finished, the substrate WF may be cooled (S14). As an example, the cooling process may include supplying a heat transfer gas (or a cooling gas) to a back side of the substrate WF through a conduit formed inside the supporting plate 11.

The process of supplying the process gas, the heating process and the cooling process may constitute a cycle. The cycle may be repeated a plurality of times. It may be determined whether the number of repetitions of the cycle reaches a predetermined number of times (N) (S15). That is, in the case where the number of the cycles does not reach the predetermined number of times (N), the cycle is repeated again. In the case where the number of cycles reaches the predetermined number of times (N), the substrate WF may be unloaded from the process chamber 1 (S16).

Figure 18:
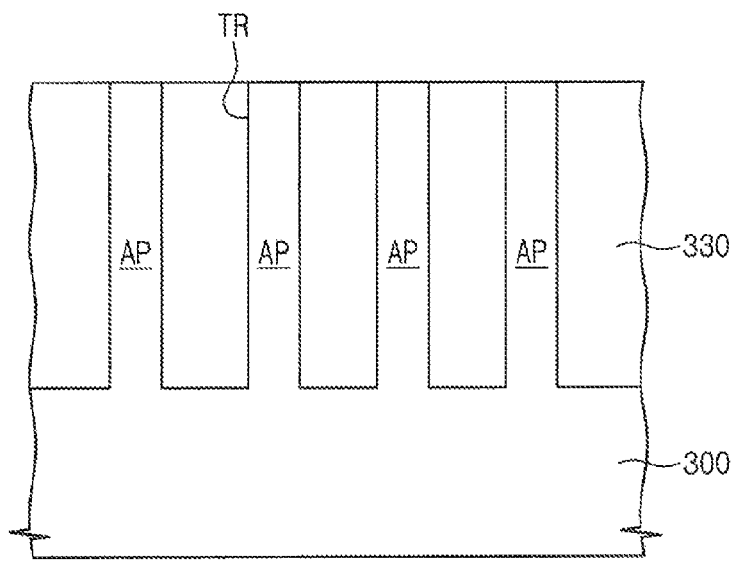
FIGS. 18 and 19 are cross sectional views for explaining a method of forming a fin structure using a dry cleaning process in accordance with an example embodiment of the inventive concept.
Figure 19:
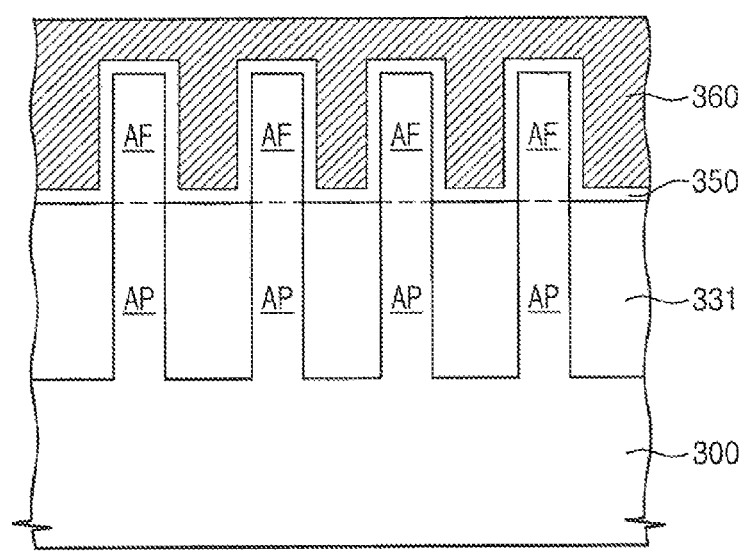

FIGS. 18 and 19 are cross sectional views for explaining a method of forming a fin structure using a dry cleaning process in accordance with an embodiment of the inventive concept.

Referring to FIG. 18, the substrate 300 may be patterned to form device isolation trenches TR defining active patterns AP. The substrate 300 may be a semiconductor substrate including silicon, germanium or silicon-germanium, and/or a compound semiconductor material. Forming the device isolation trenches TR may include forming mask patterns on the substrate 300, and anisotropically etching the substrate 300 using the mask patterns as an etching mask. Each of the device isolation trenches TR may be formed to have an aspect ratio of at least 5 or greater.

A device isolation layer 330 filling each of the device isolation trenches TR may be formed. The formation of the device isolation layer 330 may include forming an insulating layer filling the device isolation trenches TR and planarizing the insulating layer until a top surface of the mask pattern is exposed. Accordingly, the device isolation layer 330 may be locally formed in each of the device isolation trenches TR. The device isolation layer 330 may be an insulating layer including an oxide. As an example, the device isolation layer 330 may be a silicon oxide layer.

Referring to FIG. 19, upper portions of the device isolation layers 330 may be removed to form device isolation patterns 331 and to expose upper portions (e.g., active fins (AF)) of the active patterns AP. Exposing the active fins AF may be performed through the dry cleaning process according to the embodiments of the inventive concept described with reference to FIGS. 1 through 17. As a result, etching by-products are effectively removed and the device isolation patterns 331 may be uniformly formed to have the substantially same height.

After that, a gate insulating layer 350 and a gate electrode 360 may be sequentially formed on the active fins AF.

Figure 20:
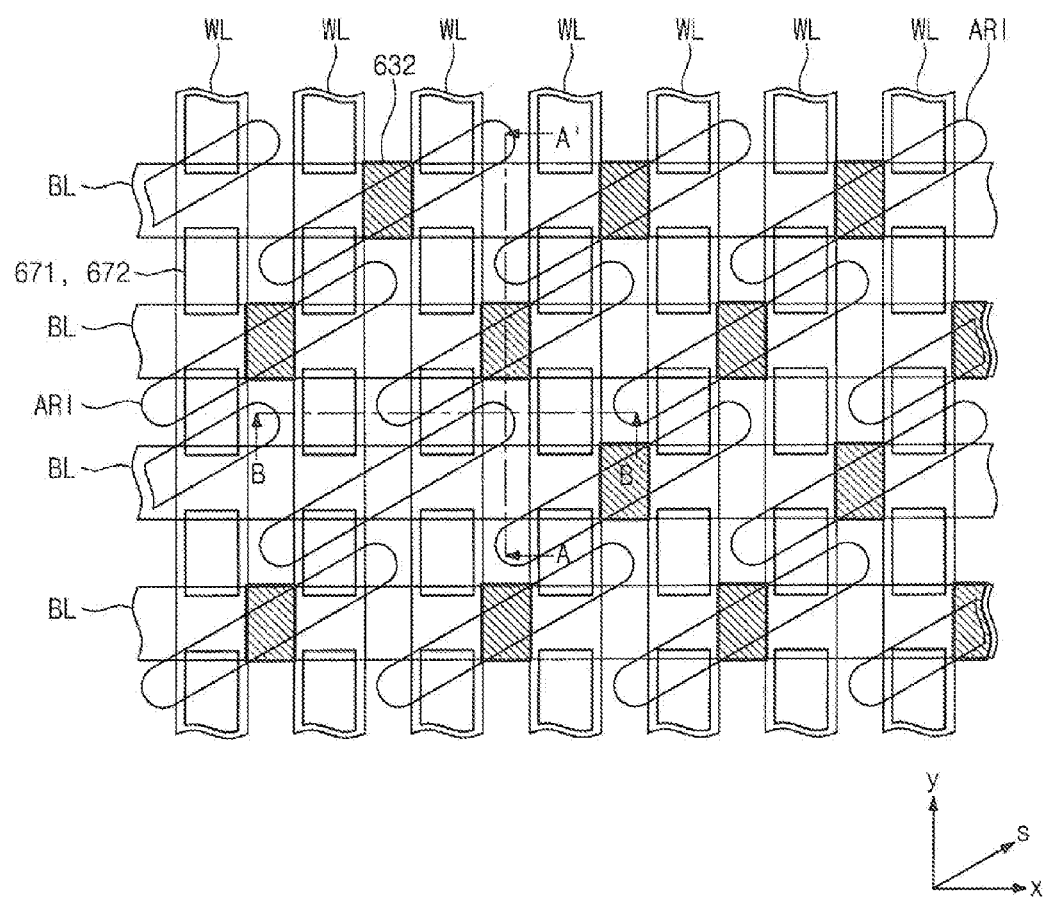
FIG. 20 is a plan view of a dynamic random access memory (DRAM) including an air gap formed using a dry cleaning process in accordance with an example embodiment of the inventive concept.
Figure 21A:
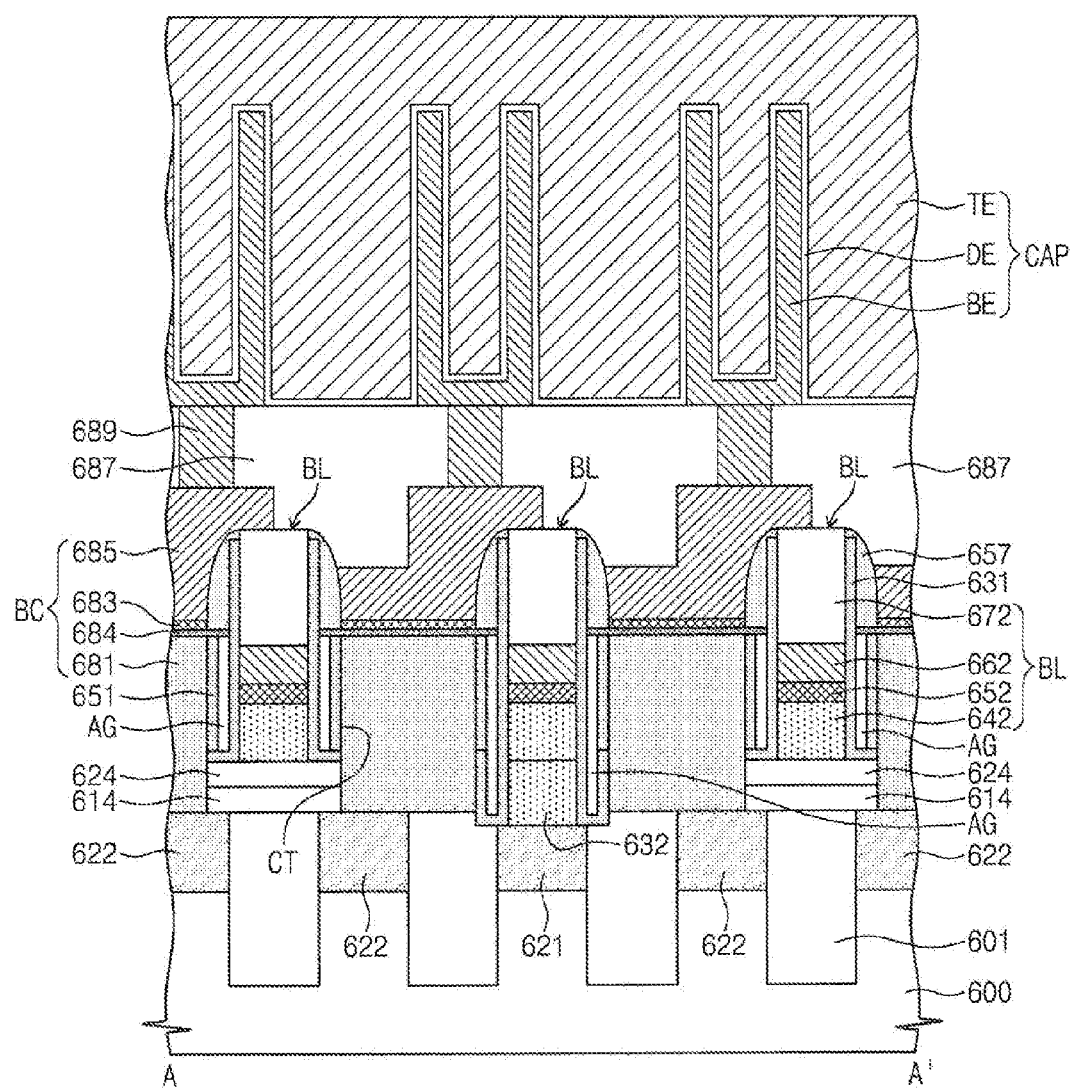
FIGS. 21A and 21B are cross sectional views taken along the lines A-A' and B-B' of FIG. 20, respectively.
Figure 21B:
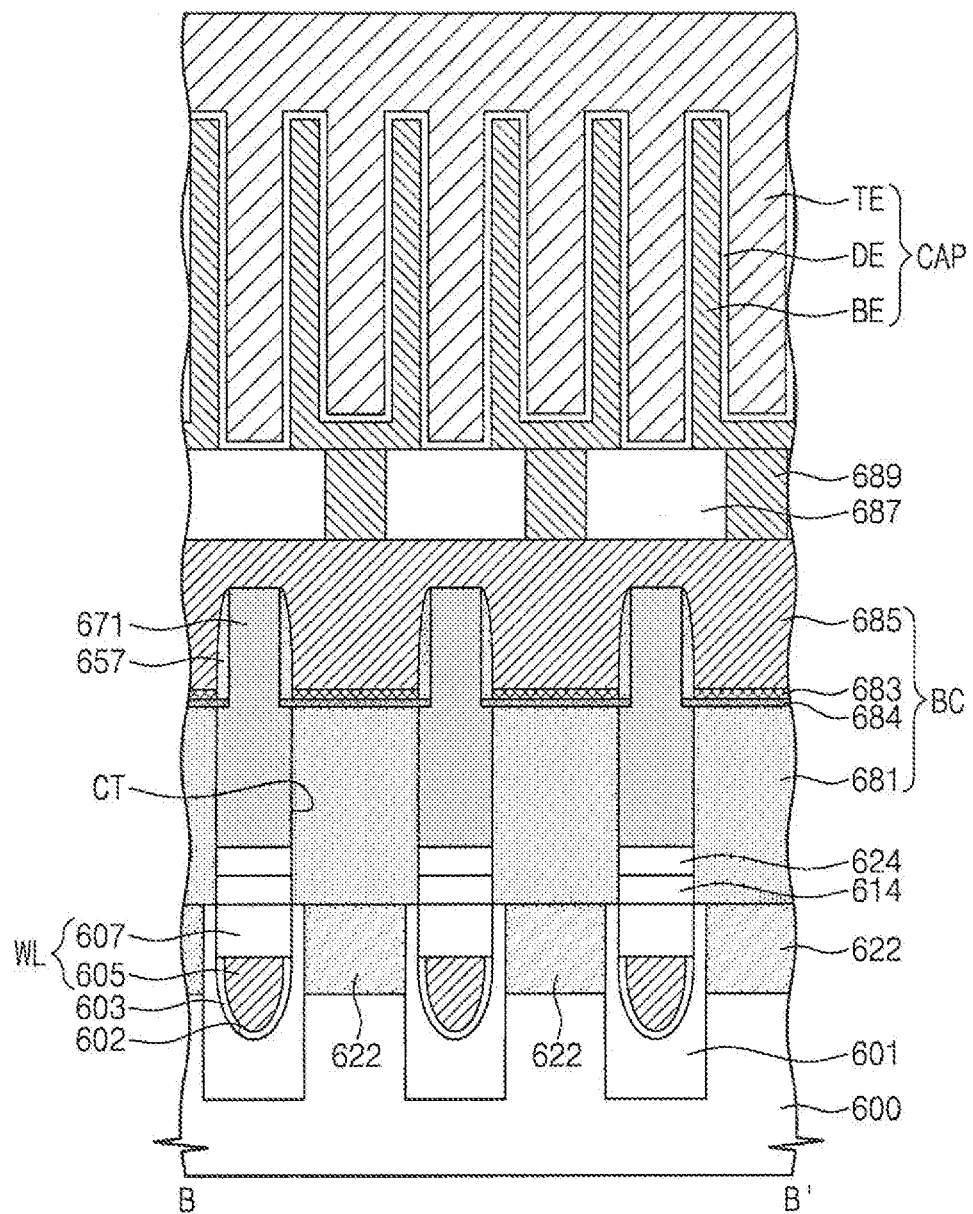

FIG. 20 is a plan view of a DRAM including an air gap formed using a dry cleaning process in accordance with an embodiment of the inventive concept. FIGS. 21A and 21B are cross sectional views taken along lines A-A' and B-B' of FIG. 20, respectively.

Device isolation layers 601 are formed in a substrate 600 to define active regions AR1. The substrate 600 may be a semiconductor substrate including silicon, germanium, or silicon-germanium. The active regions AR1 have a shape of bars horizontally separated from one another and may extend in a third direction (s direction) non-perpendicular to an x-direction and a y-direction.

First and second impurity regions 621 and 622 may be provided in upper portions of the active regions AR1. The impurity regions 621 and 622 may be regions doped with impurity ions of which a conductivity type is different from that of the substrate 600. In one active region AR1, the first impurity region 621 may be provided between a pair of the second impurity regions 622, and the first impurity region 621 and the second impurity regions 622 may be separated from one another by trenches 602.

Gate structures buried in the substrate 600 may be provided. The gate structures may be word lines WL. The word lines WL may be provided in the trenches 602 and may extend along the y-direction. Each of the word lines WL may include a gate electrode 605 and a gate capping pattern 607 that are sequentially formed in each of the trenches 602.

Conductive lines extending in the x-direction may be provided on the substrate 600. The conductive lines may be bit lines BL of a semiconductor device. Each of the bit lines BL may include a first conductive pattern 642, a barrier pattern 652, a second conductive pattern 662 and a capping pattern 672 that are sequentially formed. The first conductive pattern 642 may include poly-silicon. The barrier pattern 652 may include a metal silicide layer and/or a metal nitride layer on the metal silicide layer. The capping pattern 672 may include at least one of silicon oxide, silicon nitride and silicon oxynitride.

In an embodiment, bit line contact plugs 632 may be provided between the bit lines BL and the first impurity regions 621. The bit line contact plugs 632 may include at least one of a doped semiconductor material, a conductive metal nitride, a metal and a metal-semiconductor compound. The bit line contact plugs 632 may be connected to the first impurity regions 621. Bottom surfaces of the bit line contact plugs 632 may be lower than top surfaces of the device isolation layers 601.

A first filling pattern 614 and a second filling pattern 624 may be sequentially provided on the device isolation layer 601 between the second impurity regions 622, and the bit line BL may be provided on the second filling pattern 624. The bit lines BL may extend in the x-direction. The first filling patterns 614 may include silicon oxide and the second filling patterns 624 may include silicon nitride.

Spacer structures may be provided on sidewalls of the bit lines BL. Each of the spacer structures may include a first spacer 631 and a third spacer 651 that are sequentially formed on the sidewall of the bit line BL. An air gap AG may be provided between the first spacer 631 and the third spacer 651. The air gap AG is a region in which a solid phase material is not provided and may be a substantially empty space. A sidewall and a bottom surface of the air gap AG may be defined by the first and third spacers 631 and 651, and a top surface of the air gap AG may be defined by a conductive capping pattern 684. The air gap AG having a lower dielectric constant than a silicon oxide layer or a silicon nitride layer may minimize a parasitic capacitance affecting the bit lines BL. Thus, response time of a semiconductor device can be shortened.

Insulating fences 671 that overlap the word lines WL may be provided between the bit lines BL. The insulating fences 671 may be disposed in the y direction along the word lines WL. Contact holes CT exposing the second impurity regions 622 may be defined between the insulating fences 671 and the bit lines BL having the spacer structures, and contact plugs BC may be formed to fill the contact holes CT.

Each of the contact plugs BC may include a semiconductor pattern 681. A bottom surface of the semiconductor pattern 681 may overlap and be in contact with the second impurity region 622 and the device isolation layer 601. A sidewall of the semiconductor pattern 681 may be in contact with sidewalls of the third spacer 651 and the insulating fences 671. A height of a top surface of the semiconductor pattern 681 may be equal to or lower than a height of the top surface of the air gap AG and a height of a top surface of the third spacer 651. The semiconductor pattern 681 may include poly-silicon doped with impurities.

The conductive capping pattern 684 may be provided on the semiconductor pattern 681. The conductive capping pattern 684 may extend in a horizontal direction so as to be in contact with a sidewall of the first spacer 631 and may cover the top surface of the air gap AG and the top surface of the third spacer 651. The conductive capping pattern 684 may define the top surface of the air gap AG. The conductive capping pattern 684 may include silicon.

A fourth spacer 657 covering the top surface of the first spacer 631 may be provided on the conductive capping pattern 684. The fourth spacer 657 may include a silicon nitride layer. A metal silicide pattern 683 may be provided on the conductive capping pattern 684. A sidewall of the metal silicide pattern 683 may contact a sidewall of the fourth spacer 657. The metal silicide pattern 683 may include at least one of titanium silicide, cobalt silicide, nickel silicide, tungsten silicide, platinum silicide and molybdenum silicide.

A metal containing pattern 686 may be provided on the metal silicide pattern 683. The metal containing pattern 683 may cover an upper portion of the bit line BL. A part of the top surface of the metal containing pattern 685 may be lower than a top surface of the capping pattern 672. The metal containing pattern 685 may include tungsten, copper or aluminum.

An interlayer insulating layer 687 may be provided to fill a space between the metal containing patterns 685 and to cover a top surface of the metal containing pattern 685. The interlayer insulating layer 687 may include a silicon oxide layer and/or a silicon nitride layer.

Data storage parts may be disposed on the interlayer insulating layer 687. The data storage parts may be capacitors CAP. The capacitors CAP may include lower electrodes BE, an upper electrode TE and an insulating layer between the lower electrodes BE and the upper electrode TE. The capacitors CAP can be electrically connected to the metal containing pattern 685 through via plugs 689 penetrating the interlayer insulating layer 687. The via plugs 689 may include a conductive metal nitride (e.g., titanium nitride, tantalum nitride, and/or tungsten nitride). Thus, the capacitors CAP can be electrically connected to the second impurity regions 622 through the metal containing patterns 685. That is, the bit lines BL and the capacitors CAP can be electrically connected the first and second impurity regions 621 and 622 respectively.

Figure 22A:
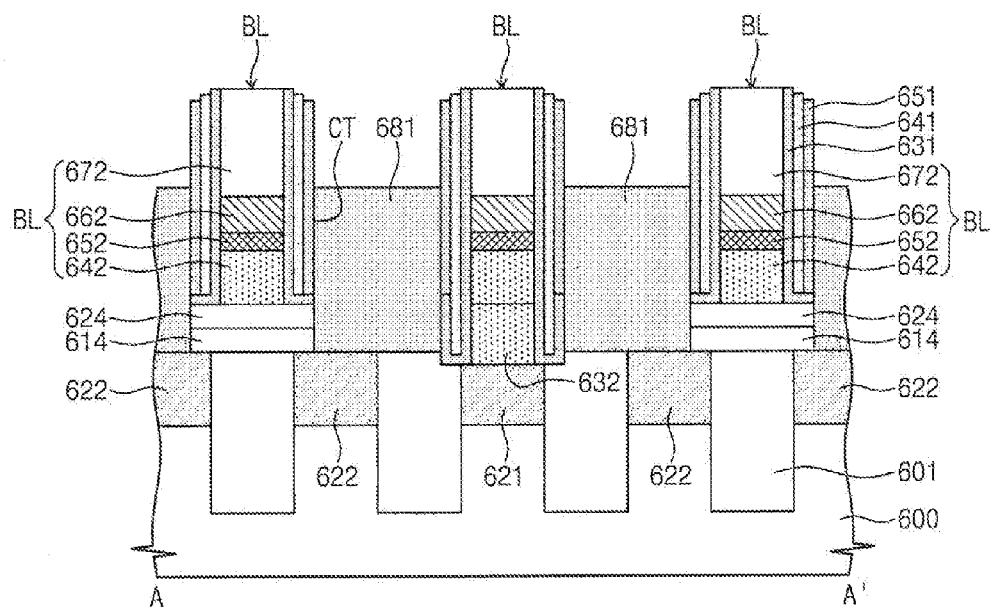
FIGS. 22A, 23A, and 24A are cross-sectional views taken along the line A-A' of FIG. 20 to explain a method of forming an air gap using a dry cleaning process in accordance with an example embodiment of the inventive concept.
Figure 22B:
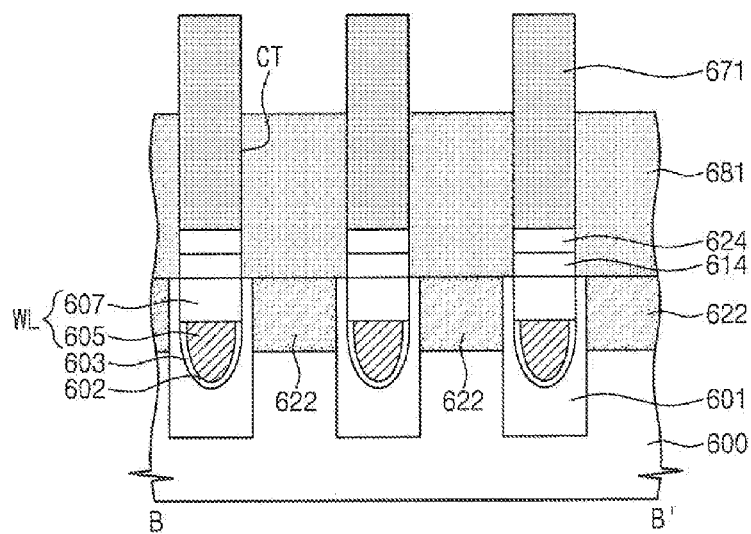
FIGS. 22B, 23B and 24B are cross sectional views taken along the line B-B' of FIG. 20 to explain a method of forming an air gap using a dry cleaning process in accordance with an example embodiment of the inventive concept.
Figure 23A:
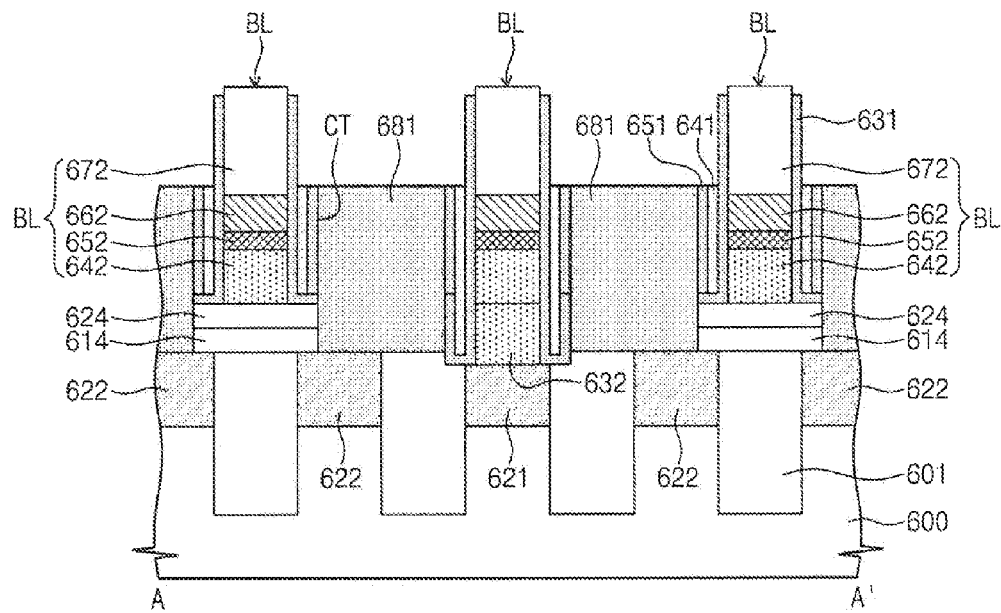
Figure 23B:
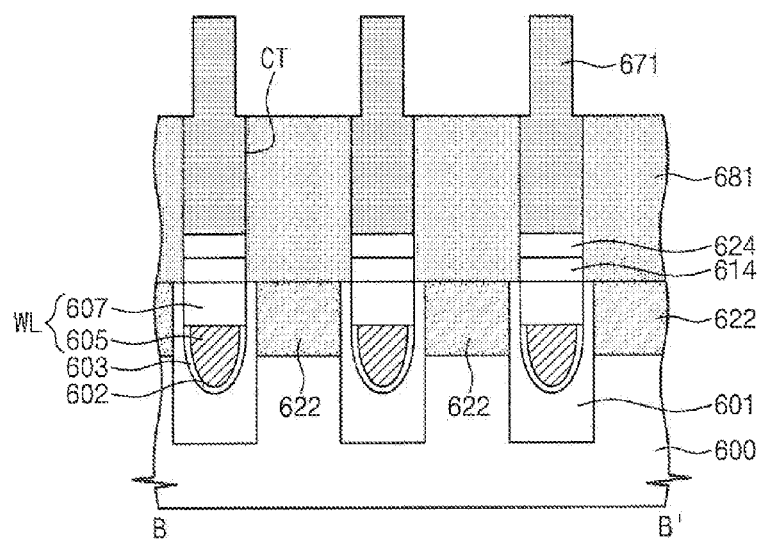
Figure 24A:
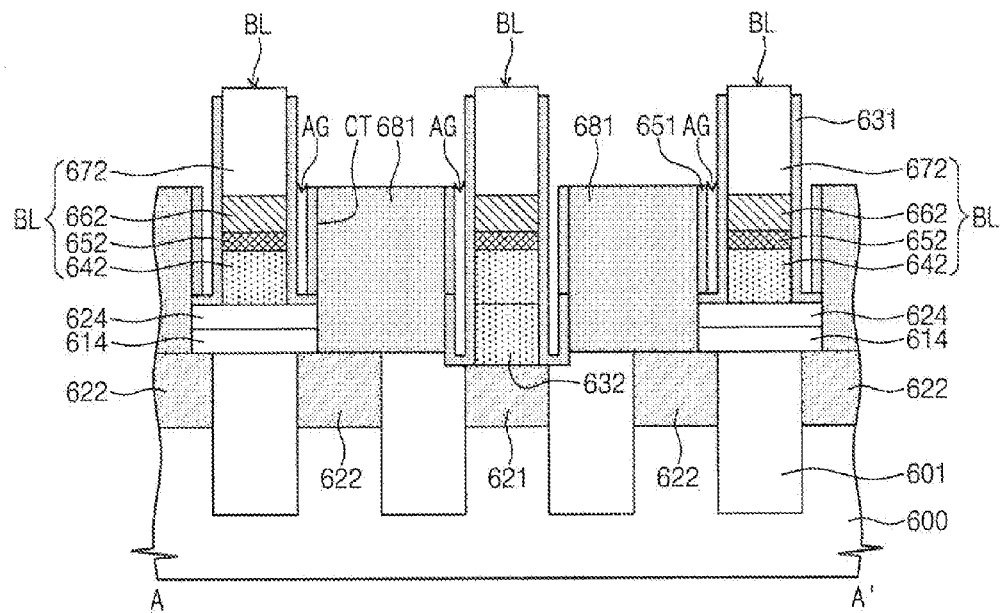
Figure 24B:
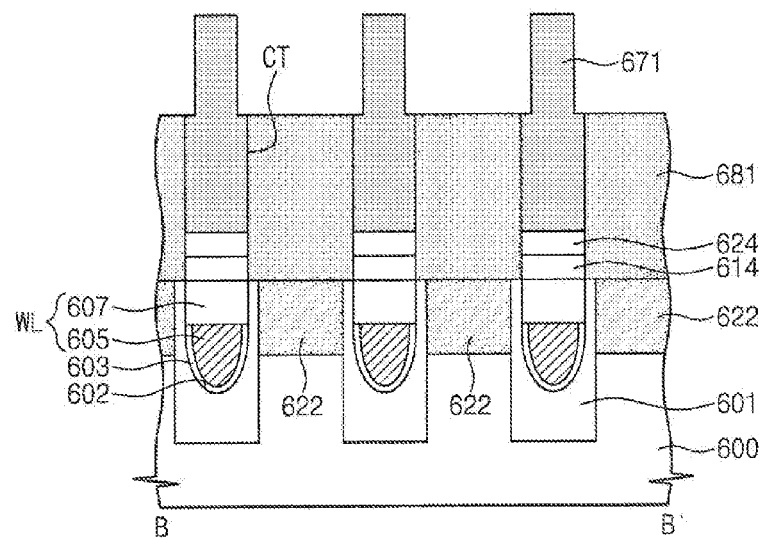

FIGS. 22A, 23A, and 24A are cross-sectional views taken along line A-A' of FIG. 20 to explain a method of forming an air gap using a dry cleaning process in accordance with an example embodiment of the inventive concept. FIGS. 22B, 23B and 24B are cross sectional views taken along line B-B' of FIG. 20 to explain a method of forming an air gap using a dry cleaning process in accordance with an example embodiment of the inventive concept. For easy description, elements duplicated with the embodiment described with reference to FIGS. 21A and 21B will be described in brief or omitted.

Referring to FIGS. 20, 22A, 22B, 23A and 23B, an etching process may be performed on the resulting structure having the semiconductor patterns 681 and the first to spacers 631 to 651 formed on the sidewalls of the bit line BL, thereby removing a part of the second and third spacers 641 and 651. That is, the etching process is performed until a top surface of the semiconductor pattern 681 is substantially coplanar with top surfaces of the second and third spacers 641 and 651. As a result, a sidewall of the first spacer 631 higher than the top surface of the semiconductor pattern 681 may be exposed. A part of the first spacer 631 and parts of the insulating fences 671 may be removed by the etching process.

Referring to FIGS. 20, 24A and 24B, the second spacer 641 may be selectively removed to form an air gap AG between the first spacer 631 and the third spacer 651. A sidewall and a bottom surface of the air gap AG may be defined by the first and third spacers 631 and 6851. A process of removing the second spacer 641 may be performed through the dry cleaning process according to the example embodiments of the inventive concept described with reference to FIGS. 1 through 17. As a result, etching byproducts are effectively removed and thereby the air gap AG can be uniformly formed.

After that, the contact plugs BC and the capacitors CA may be sequentially formed.

Figure 25:
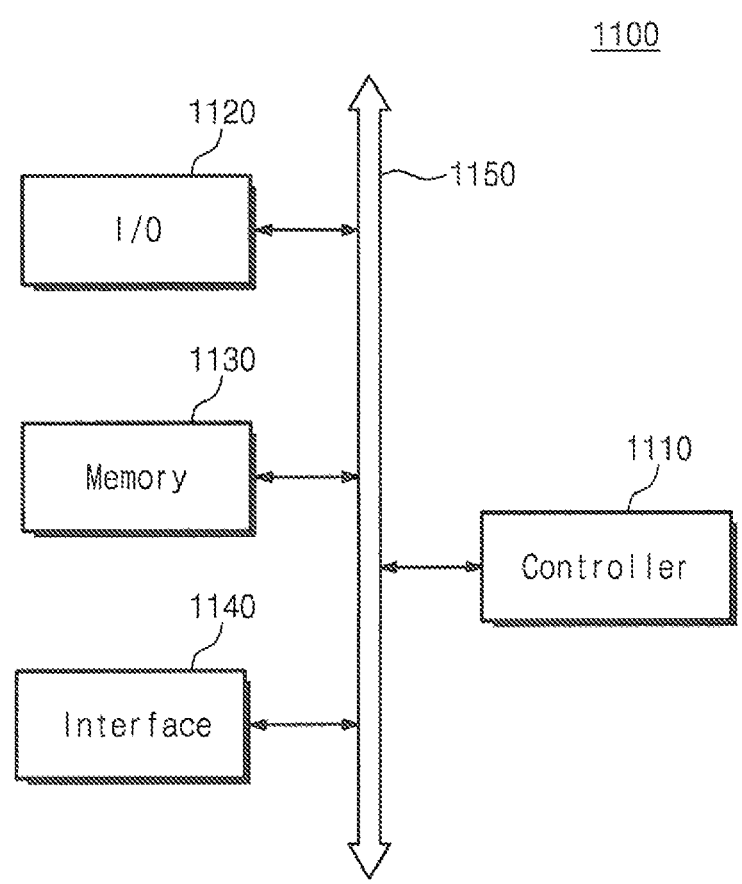
FIG. 25 is a block diagram illustrating an example of an electronic system including a semiconductor device manufactured according to example embodiments of the inventive concept.

FIG. 25 is a block diagram illustrating an example of an electronic system including a semiconductor device manufactured according to example embodiments of the inventive concept.

Referring to FIG. 25, an electronic system 1100 in accordance with embodiments of the inventive concept may include a controller 1110, an input/output (I/O) device 1120, a memory device 1130, an interface 1140 and a bus 1150. The controller 1110, the input/output (I/O) device 1120, the memory device 1130 and/or the interface 1140 may be combined with one another through the bus 1150. The bus 1150 corresponds to a path through which data moves. The memory device 1130 may include a semiconductor device in accordance with example embodiments of the inventive concept.

The controller 1110 may include at least one among a microprocessor, a digital signal process, a microcontroller and logical device that can perform functions similar to the microprocessor, the digital signal process and the microcontroller. The I/O device 1120 may include a keypad, a keyboard and a display device. The memory device 1130 can store data and/or commands. The interface 1140 can perform a function of transmitting data to a communication network or receiving data from a communication network. The interface 1140 may have a wired or wireless form. For instance, the interface 1140 may include an antenna or a wired and wireless transceiver. Although not illustrated, the electronic system 1100 may further include a high speed DRAM device and/or a SRAM device as an operation memory device for improving an operation of the controller 1110.

The electronic system 1100 can be applied to a PDA (personal digital assistant), a portable computer, a web tablet, a wireless phone, a mobile phone, a digital music player, a memory card, or an electronic device that can transmit and/or receive information under a wireless environment.

Figure 26:
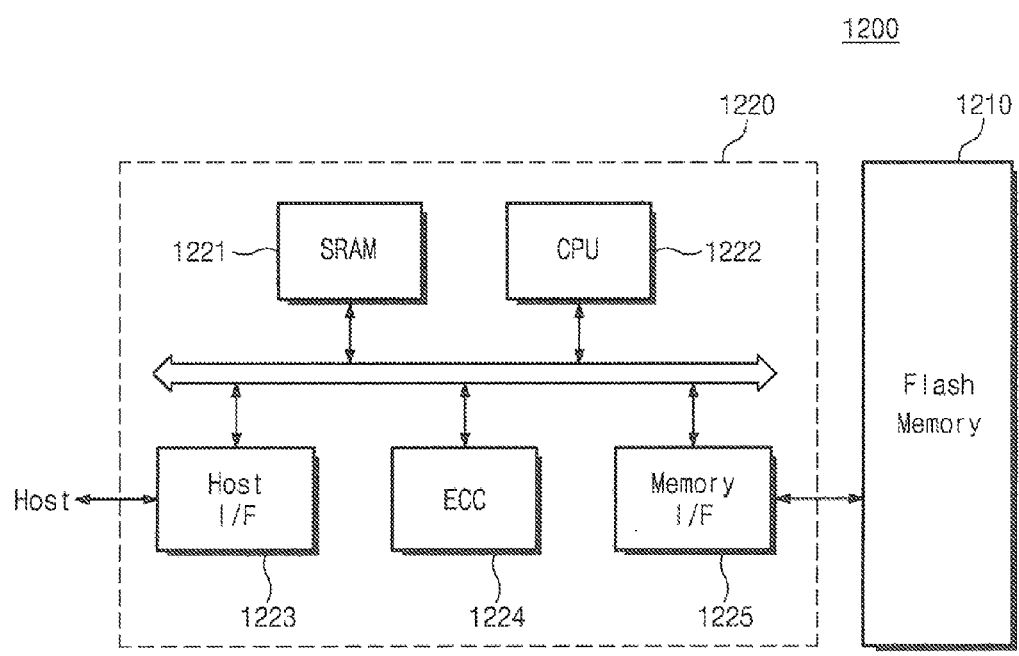
FIG. 26 is a block diagram illustrating an example of a memory card including a semiconductor device manufactured according to example embodiments of the inventive concept.

FIG. 26 is a block diagram illustrating an example of a memory card including a semiconductor device manufactured according to example embodiments of the inventive concept.

Referring to FIG. 26, a memory card 1200 includes a memory device 1210. The memory device 1210 may include at least one of the semiconductor devices disclosed in the aforementioned embodiments. The memory device 1210 may further include a semiconductor memory device (e.g., a DRAM device and/or a SRAM device) of different type. The memory card 1200 may include a memory controller 1220 that controls a data exchange between a host and the memory device 1210. The memory device 1210 and/or the controller 1220 may include a semiconductor device in accordance with embodiments of the inventive concept.

The memory controller 1220 may include a processing unit 1222 that controls an overall operation of the memory card. The memory controller 1220 may include a SRAM 1221 being used as an operating memory of the processing unit 1222. In addition, the memory controller 1220 may further include a host interface 1223 and a memory interface 1225. The host interface 1223 may include a data exchange protocol between the memory card 1200 and a host. The memory interface 1225 can connect the memory controller 1220 to the memory device 1210. Further, the memory controller 1220 may further include an error correction block 1224. The error correction block 1224 can detect and correct an error of data read from the memory device 1210. Although not illustrated, the memory card 1200 may further include a ROM device that stores code data for an interfacing with the host. The memory card 1200 may be used as a portable data storage card. Unlike this, the memory card 1200 may be embodied by a SSD (solid state disk) that can replace a hard disk of a computer system.

Figure 27:
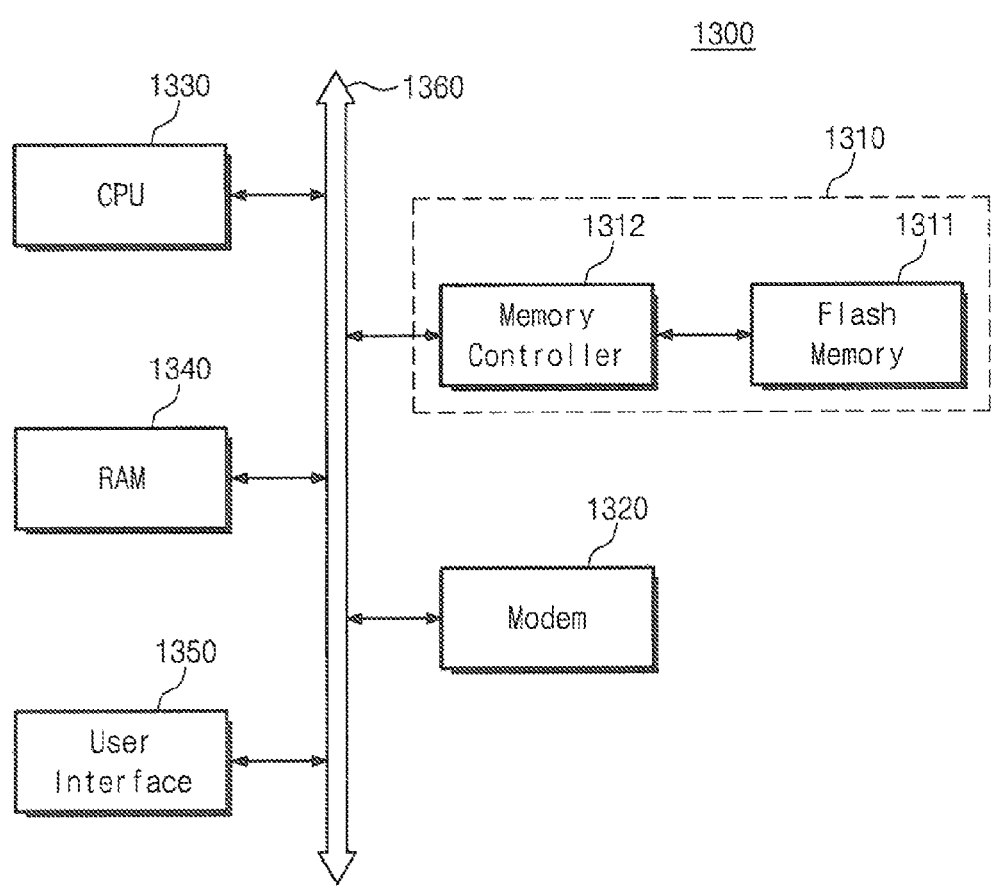
FIG. 27 is a block diagram illustrating an example of an information processing system including a semiconductor device manufactured according to example embodiments of the inventive concept.

FIG. 27 is a block diagram illustrating an example of an information processing system including a semiconductor device manufactured according to example embodiments of the inventive concept.

Referring to FIG. 27, a flash memory system 1310 according to example embodiments of the inventive concept is built in an information processing system such as a mobile device or a desk top computer. The information processing system 1300 includes the flash memory system 1310, and a modem 1320, a central processing unit 1330, a RAM 1340 and a user interface 1350 that are electrically connected to a system bus 1360. The flash memory system 1310 may be constituted to be the same with the aforementioned memory system. The flash memory system 1310 stores data processed by the central processing unit 1330 and data inputted from the outside. The flash memory system 1310 may be constituted by a solid state disk (SSD) and in this case, the information processing system 1300 can stably store large amounts of data in the flash memory system 1310. As reliability increases, the flash memory system 1310 can save resources that are necessary for an error correction and thereby can provide a high speed data exchange function to the information processing system 1300. Although not illustrated, the information processing system 1300 may further include an application chipset, a camera image processor (CIS), an input/output device, etc.

The memory device or the memory system in accordance with example embodiments of the inventive concept may be mounted by various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to a method of manufacturing a semiconductor device in accordance with the inventive concept, a process of removing an insulating, in particular, an oxide layer and a process of cleaning a contact hole can be effectively performed. As a result, an incomplete removal of an insulating layer or an incomplete cleaning of a contract hole can be improved and a loading phenomenon can be improved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A method of manufacturing a semiconductor device comprising:

loading a substrate into a chamber, on which an insulating layer comprising an oxide is formed; and injecting a process gas comprising an etching source gas into the chamber to remove at least a portion of the insulating layer, wherein the process of removing at least a portion of the insulating layer is performed in a pulse type in which a first period and a second period are repeated a plurality of times, wherein the etching source gas is supplied at a first flow rate during the first period and is supplied at a second flow rate less than the first flow rate during the second period, wherein a temperature of the inside of the chamber remains at 100° C. or more during the process of the removing the portion of the insulating layer, wherein a pressure of the process gas in the chamber during the first and second periods is changed in such a way that a third period and a fourth period are alternately repeated, and wherein the pressure of the process gas in the chamber remains at a first pressure during the third period and remains at a second pressure lower than the first pressure during the fourth period.

2. The method of manufacturing a semiconductor device of claim 1, wherein the second period is an off state in which supply of the etching source gas is interrupted such that the supply of the etching source gas is repeatedly turned-on and turned-off during the process of removing the at least a portion of the insulating layer.

3. The method of manufacturing a semiconductor device of claim 1, wherein the second period is longer than the first period.

4. The method of manufacturing a semiconductor device of claim 3, wherein the second period is from 3 to 15 times as long as the first period.

5. The method of manufacturing a semiconductor device of claim 3, wherein the first period ranges from 1 second to 20 seconds, and the second period ranges from 5 seconds to 60 seconds.

6. The method of manufacturing a semiconductor device of claim 1, wherein sublimation of etching by-products generated while the insulating layer is removed, proceeds during the second period.

7. The method of manufacturing a semiconductor device of claim 1, wherein the process gas is supplied into the chamber in a gas state that does not become plasma, or by a remote plasma method.

8. The method of manufacturing a semiconductor device of claim 1, wherein the etching source gas comprises HF and $NH_3$ or comprises at least two of $NF_3$, $NH_3$, HF or $H_2$.

9. The method of manufacturing a semiconductor device of claim 1, wherein the process gas is purged during the fourth period.

10. The method of manufacturing a semiconductor device of claim 1, wherein a start point and an end point of the third period is the same as a start point and an end point of the first period, respectively, and wherein a start point and an end point of the fourth period is the same as a start point and an end point of the second period, respectively.

11. The method of manufacturing a semiconductor device of claim 1, wherein a start point and an end point of the third period are later than a start point and an end point of the first period, respectively, and wherein a start point and an end point of the fourth period are later than a start point and an end point of the second period, respectively.

12. A dry cleaning method comprising:

loading a substrate into a chamber, on which an insulating layer comprising an oxide is formed; and removing at least a portion of the insulating layer by injecting a process gas comprising an etching source gas into the chamber, wherein the process of removing at least a portion of the insulating layer is performed in a pulse type in which a first period comprising an on-state and a second period comprising an off-state of supplying of the etching source gas are alternately repeated a plurality of times, wherein a temperature of the inside of the chamber remains at 100° C. or more during the process of removing the at least a part of the insulating layer, wherein a pressure of the process gas in the chamber during the first and second periods is changed in such a way that a third period and a fourth period are alternately repeated, and wherein the pressure of the process gas in the chamber remains at a first pressure during the third period and remains at a second pressure lower than the first pressure during the fourth period.

13. The dry cleaning method of claim 12, wherein a pulse interval corresponding to the on-state of the supplying of the etching source gas is less than a pulse interval corresponding to the off-state of the supplying of the etching source gas.

14. The dry cleaning method of claim 12, wherein a temperature of the inside of the chamber remains at 200° C. or less during the process of removing at least a portion of the insulating layer.

15. The dry cleaning method of claim 12, wherein sublimation, of etching by-products generated while the insulating layer is removed, proceeds during the off-state.

16. The dry cleaning method of claim 12, wherein the process gas is purged during the off-state.

17. The dry cleaning method of claim 12, wherein the etching source gas comprises HF and $NH_3$ or comprises at least two of $NF_3$, $NH_3$, HF or $H_2$.

18. A method of manufacturing a semiconductor device corn prising:

forming a first layer and a second layer comprising a material having an etch selectivity with respective to the first layer, on a substrate, the first layer comprising an insulating material and horizontally adjacent to the second layer; and removing at least a portion of the first layer, wherein the process of removing the at least a portion of the first layer comprises:

loading a substrate on which the first and second layers are formed, into a chamber; and supplying a process gas comprising an etching source gas into the chamber in a pulse type in which a first period and a second period are repeated a plurality of times, wherein the etching source gas is supplied at a first flow rate during the first period and is supplied at a second flow rate less than the first flow rate during the second period, wherein a temperature of the inside of the chamber remains at 100° C. or more during the removing, the at least a part of the first layer, wherein a pressure of the process gas in the chamber during the first and second periods is changed in such a way that a third and a fourth period are alternately repeated, and wherein the pressure of the process gas in the chamber remains at a first pressure during the third period and remains at a second pressure lower than the first pressure during the fourth period.

19. The method of manufacturing a semiconductor device of claim 18, wherein a start point and an end point of the third period is the same as a start point and an end point of the first period, respectively, and wherein a start point and an end point of the fourth period is the same as a start point and an end point of the second period, respectively.

20. The method of manufacturing a semiconductor device of claim 18, wherein a start point and an end point of the third period are later than a start point and an end point of the first period, respectively, and wherein a start point and an end point of the fourth period are later than a start point and an end point of the second period, respectively.

* * * * *